United States Patent [19]
Gajeski et al.

[11] Patent Number: 5,644,106
[45] Date of Patent: Jul. 1, 1997

[54] THERMISTOR HOLDER

[75] Inventors: Paul J. Gajeski; G. Lynnette Marks, both of Muskegon, Mich.

[73] Assignee: Therm-O-Disc, Incorporated, Mansfield, Ohio

[21] Appl. No.: 321,105

[22] Filed: Oct. 11, 1994

[51] Int. Cl.⁶ .................................................... H05K 7/02
[52] U.S. Cl. .................................... 174/138 G; 248/74.2
[58] Field of Search .................. 174/138 G, 138 E, 174/138 H, 135, 52.1; 248/74.2, 74.4, 316.6; D13/199, 154; D8/354

[56] References Cited

U.S. PATENT DOCUMENTS

| | | | |
|---|---|---|---|
| 4,606,120 | 8/1986 | McAndrew | 174/138 G X |
| 4,623,754 | 11/1986 | Kikuchi et al. | 174/52.1 |
| 4,968,962 | 11/1990 | Hohider et al. | 174/138 G X |
| 5,590,567 | 1/1997 | Marrs et al. | 248/74.2 X |

*Primary Examiner*—Hyung S. Sough
*Assistant Examiner*—Paramita Ghosh
*Attorney, Agent, or Firm*—Jones, Day, Reavis & Pogue

[57] ABSTRACT

A plastic holder for a thermistor includes a base portion having opposite ends and a thermistor support surface. Endwalls extend outwardly from the support surface for receiving a thermistor therebetween. Outwardly extending abutments on the base portion adjacent its opposite ends inhibit displacement of the holder from a pocket on a spring clip. One of the endwalls has an oppositely extending extension wall with a recess in its outer end for receiving an electrical lead. A thermistor retainer projection extends outwardly from the base portion perpendicular to the support surface intermediate its opposite ends.

13 Claims, 2 Drawing Sheets

THERMISTOR HOLDER

BACKGROUND OF THE INVENTION

This application relates to arrangements for positioning electric circuit components and, more particularly, to arrangements for attaching electric circuit components to other structure. The invention is particularly applicable for attaching thermistors to cylindrical tubing and will be described with specific reference thereto. However, it will be appreciated that the invention has broader aspects and can be used for other components and in other environments.

Thermistors are commonly potted to a spring clip for attachment to cylindrical tubing that forms a coil in heating, ventilating and air conditioning equipment. Potting is an expensive and time-consuming process, and voids in the potting compound can cause dielectric failures and poor thermal coupling. Potting material frequently cracks and penetration of moisture can change the resistance of the thermistor so that it no longer operates as intended. Elimination of the potting material, or the alternative use of injection molding, result in assemblies that have poor thermal properties. It would be desirable to have an improved arrangement for attaching thermistors to cylindrical tubing.

SUMMARY OF THE INVENTION

A thermistor is attached to a one-piece plastic holder which is then positioned within a pocket on a metal spring clip that is attachable to a cylindrical tube.

The plastic holder comprises a body having a base portion with a thermistor support surface thereon and opposite ends. Endwalls extend outwardly from the base portion substantially perpendicular to the support surface. A thermistor is positionable on the support surface between the endwalls and openings in the endwalls receive wire leads on the thermistor.

In a preferred arrangement, the holder includes abutments adjacent the opposite ends thereof for retaining the holder within a pocket on a metal spring clip.

One of the endwalls has an opposite extension wall with an opening therein for receiving a wire lead on a thermistor.

The front faces of the endwalls are concavely curved to correspond with the curvature of an outwardly curved leg on a spring clip.

A thermistor retainer projection extends outwardly from the base portion of the plastic holder substantially perpendicular to the thermistor support surface intermediate the opposite endwalls.

It is a principal object of the present invention to provide an improved arrangement for attaching thermistors to cylindrical tubing.

It is another object of the invention to provide an improved plastic holder for electrical circuit components.

It is an additional object of the invention to provide an improved combination metal spring clip and plastic holder for thermistors.

DESCRIPTION OF A PREFERRED EMBODIMENT

Figure 1:
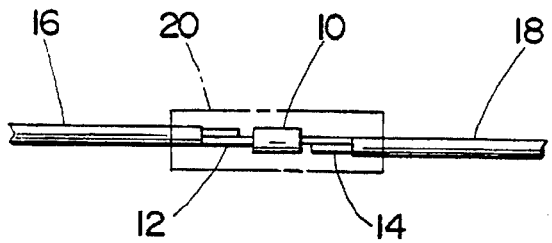
FIG. 1 is a plan view showing a thermistor and wire lead subassembly.

Referring now to the drawing, wherein the showings are for purposes of illustrating a preferred embodiment of the invention only and not for purposes of limiting same, FIG. 1 shows a glass encapsulated thermistor 10 having leads connected by solder joints 12, 14 with insulated wire leads 16, 18. Adhesive-filled shrink tube 20 is positioned around thermistor 10 and joints 12, 14. Heat is then applied to the shrink tube for melting the adhesive and shrinking the tube down into moisture sealing relationship around the thermistor and solder joints.

Figure 2:
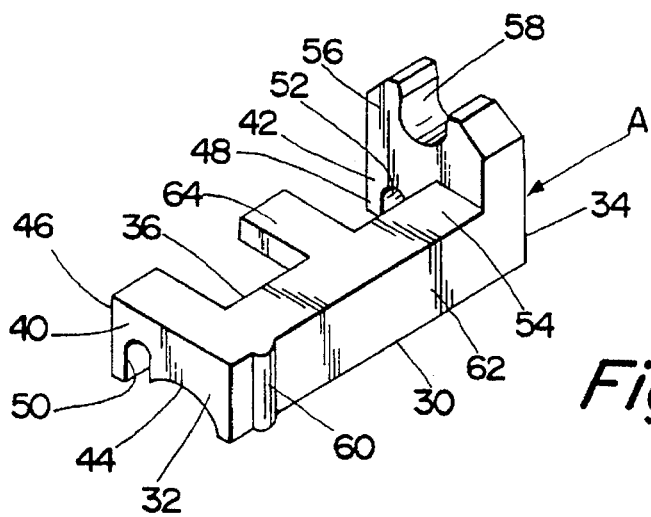
FIG. 2 is a perspective illustration of a plastic holder constructed in accordance with the present application.

FIG. 2 shows a plastic holder A defined by a body having an elongated base portion 30 with opposite ends 32, 34 and a thermistor support surface 36. Endwalls 40, 42 extend outwardly from base portion 30 adjacent opposite ends 32, 34 thereof substantially perpendicular to support surface 36. Endwalls 40, 42 have front surfaces that are concavely curved as shown at 44 for the front surface of endwall 40. It will be understood that endwall 42 has a corresponding concavely curved front surface. The body of holder A is preferably made of dielectric plastic material although other materials can be used and dielectric properties are not required in view of shrink tube 20.

Endwalls 40, 42 have outer terminal ends 46, 48 and the front surfaces thereof are provided with wire lead receiving recesses 50, 52. Recesses 50, 52 preferably have narrowed entrances leading to larger cylindrical openings so that insulated leads 16, 18 of FIG. 1 can be snapped into recesses 50, 52. The insulated leads are preferably a snug fit within the openings.

Endwall 42 extends outwardly from rear surface 54 of base portion 30 to define an extension wall portion 56 having a wire lead receiving recess 58 in its outer end. Recess 58 preferably has a narrowed entrance to a cylindrical opening so that a wire lead 16 or 18 can be snapped therein. The cylindrical opening is sized to grip the insulated lead.

A rib 60 projects outwardly from bottom surface 62 adjacent end 32. Rib 60 defines an abutment for retaining holder A within a pocket on a metal spring clip. Extension wall portion 56 also acts as an opposite abutment for retaining holder A against displacement from within a pocket on a metal spring clip.

A retainer projection 64 extends outwardly from base portion 30 substantially perpendicular to support surface 36 intermediate endwalls 40, 42. The length of retainer projection 64 from support surface 36 to its outer terminal end is substantially the same as the length of endwalls 40, 42 from support surface 36 to outer terminal ends 46, 48.

Figure 4:
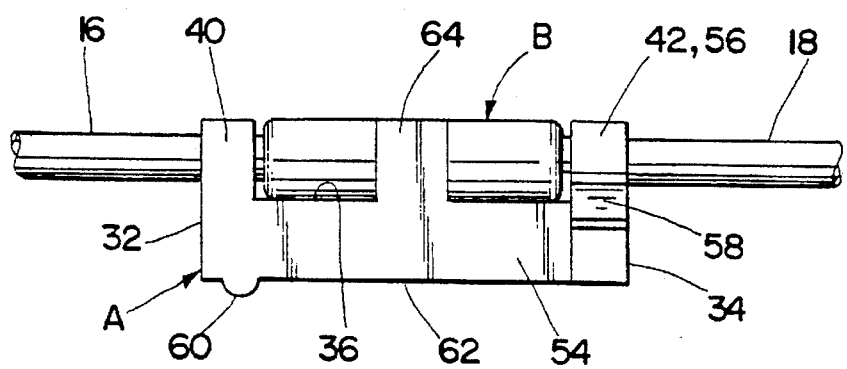
FIG. 4 s a rear elevational view of the holder of FIG. 2 with the thermistor assembly of FIG. 1 mounted thereon.

The thermistor assembly of FIG. 1 is identified by letter B in FIG. 4 and is positioned on support surface 36 between endwalls 40, 42. Retainer projection 64 prevents displacement of thermistor assembly B toward rear surface 54.

Figure 3:
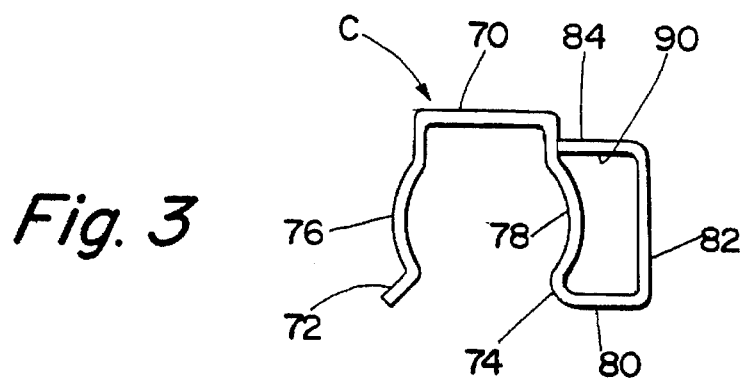
FIG. 3 is an end elevational view of a metal spring clip for use with the holder of FIG. 9.

FIG. 3 shows a metal spring clip C having a substantially U-shaped portion that includes a base 70 and a pair of spaced-apart legs 72, 74 that are outwardly curved at 76, 78 for resilient gripping reception over a cylindrical tube of about the same curvature. Leg 74 has an integral extension thereon bent outwardly at 80, upwardly at 82 and then back inwardly at 84 to define an elongated pocket 90.

Figure 5:
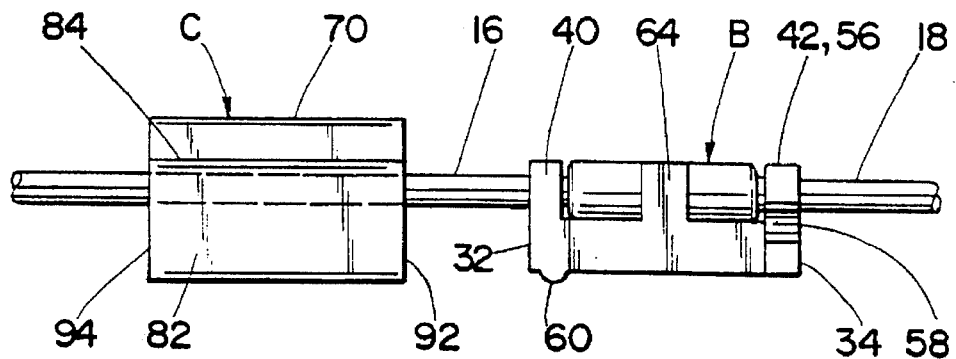
FIG. 5 is an elevational view showing how the assembly of FIG. 4 is attached to the metal spring clip of FIG. 3.

FIG. 5 shows the pocket on metal spring clip C as having opposite ends 92, 94. Wire lead 16 is extended through the pocket, and holder A and clip C are then moved toward one another for positioning holder A within pocket 90 of FIG. 3. Holder A has a length slightly greater than the length of pocket 90 so that abutment 60 will snap out from the pocket adjacent clip end 94 while extension wall 56 on holder A will be located closely adjacent clip end 92. This will retain holder A within the clip pocket against accidental displacement therefrom. It will be recognized that the material forming holder A will deform resiliently to allow axial insertion within clip pocket 90. Once holder A is positioned within pocket 90, wire lead 16 is bent back toward wire lead 18 and is snapped into recess 58 on extension wall 56.

Figure 6:
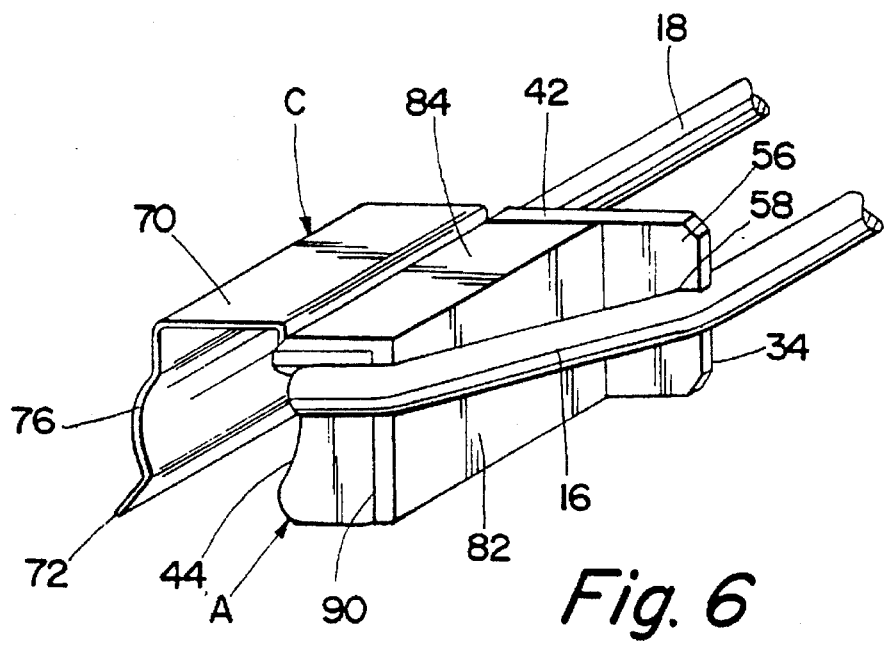
FIG. 6 is a perspective illustration showing the assembly of FIG. 4 attached to the metal spring clip of FIG. 3.
Figure 7:
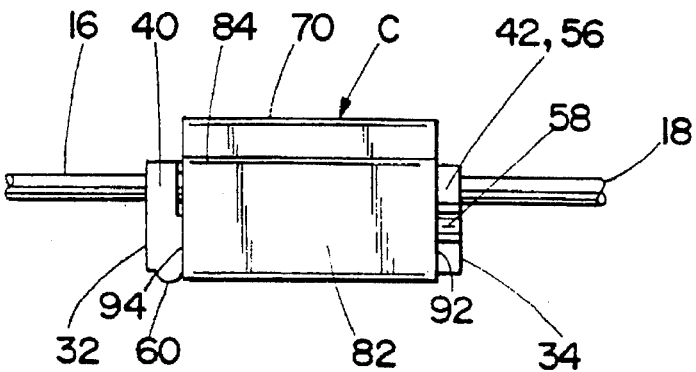
FIG. 7 is a side elevational view similar to FIG. 5 and showing the assembly after the plastic holder is fully received in the spring clip pocket.

Concavely curved front surface 44 on endwall 40 and the corresponding concave front surface on endwall 42 are positioned against outwardly curved portion 78 on spring clip leg 74. Thermistor assembly B will be in firm engagement with the outer surface of curved portion 78 on spring clip leg 74 within pocket 90 for good heat transfer. FIG. 6 is a perspective illustration of the assembled clip and holder.

Although the invention has been shown and described with respect to a preferred embodiment, it is obvious that equivalent alterations and modifications will occur to others skilled in the art upon the reading and understanding of this specification. The present invention includes all such equivalent alterations and modifications, and is limited only by the scope of the claims.

We claim:

1. Apparatus for attaching a thermistor to a cylindrical tube comprising a spring clip having a substantially U-shaped portion with outwardly curved legs for snapping onto the cylindrical tube, a pocket outwardly of one of said legs, and a dielectric holder for the thermistor received in said pocket.

2. A holder for an electrical circuit component, said holder comprising a body having an elongated base portion with opposite ends and a support surface for the electrical circuit component, endwalls extending outwardly from said support surface adjacent said ends of said base portion, said endwalls having openings therein for receiving leads on the electrical circuit component positionable between said endwalls on said support surface, concave inward surface portions extending into said endwalls separately and independently of said openings or of entrances to said openings, and said concave inward surface portions extending laterally away from said openings and from the entrances to said openings.

3. The holder of claim 2 wherein said endwalls have peripheral surface portions in which said openings and said concave inward surface portions are formed, said openings being substantially off-center on said peripheral surface portions and said concave inward surface portions extending laterally away from said openings on one side only of said openings.

4. A holder for an electric circuit component, said holder comprising a body having an elongated base portion with opposite ends and a component support surface, endwalls extending outwardly from said component support surface adjacent said ends of said base portion, said endwalls having openings therein for receiving leads on the electrical circuit component positionable between said endwalls on said support surface, and abutments extending outwardly from said base portion adjacent said ends for locking said holder in a pocket on a spring clip.

5. The holder of claim 4 wherein one of said abutments comprises a projection extending outwardly from said base portion on the opposite side thereof from said support surface.

6. The holder of claim 5 wherein another of said abutments comprises an extension of one of said endwalls.

7. A holder for an electric circuit component, said holder comprising a body having an elongated base portion with opposite ends and a component support surface, endwalls extending outwardly from said component support surface adjacent said ends of said base portion, said endwalls having openings therein for receiving leads on the electrical circuit component positionable between said endwalls on said support surface, and a retainer projection extending outwardly from said base portion substantially perpendicular to said support surface.

8. A holder for an electric circuit component, said holder comprising a body having an elongated base portion with opposite ends and a component support surface, endwalls extending outwardly from said component support surface adjacent said ends of said base portion, said endwalls having openings therein for receiving leads on the electrical circuit component positionable between said endwalls on said support surface, and one of said endwalls including an oppositely extending endwall extension having an opening therein for receiving one of the leads on the electrical circuit component that is positionable between said endwalls on said support surface.

9. A one-piece holder for an electrical circuit component comprising a body having an elongated base portion with opposite ends and a component support surface, endwalls extending outwardly from said base portion adjacent said opposite ends, said endwalls having concave front faces, and a retainer projection extending outwardly from said base portion substantially perpendicular to said support surface intermediate said endwalls.

10. A one-piece holder for an electrical circuit component comprising a body having an elongated base portion with opposite ends and a component support surface, endwalls extending outwardly from said base portion adjacent said opposite ends, said endwalls having concave front faces, an extension wall on one of said endwalls, said extension wall having a recess therein for receiving one of the leads on the electrical circuit component that is positionable between said endwalls on said support surface, and said extension wall facing outwardly in an opposite direction from said front face on said one of said endwalls.

11. A one-piece holder for an electrical circuit component comprising a body having an elongated base portion with opposite ends and a component support surface, endwalls extending outwardly from said base portion adjacent said opposite ends, said endwalls having concave front surfaces, a spring clip having a generally U-shaped portion for snapping onto a cylindrical tube, said U-shaped portion including a pair of spaced-apart legs that have outwardly curved portions for receiving the cylindrical tube, an integral pocket formed in said clip outwardly of one of said legs, and said holder being received in said pocket with said concave front surfaces on said endwalls of said holder engaging the outwardly curved portion of said one of said legs on said spring clip.

12. The holder of claim 11 wherein said pocket has a pocket length and said holder has a length greater than said pocket length, said pocket having opposite pocket ends, said base portion of said holder having abutments extending outwardly therefrom outwardly of and adjacent to said pocket ends for retaining said holder in said pocket.

13. A holder for an electrical circuit component, said holder comprising a body having an elongated base portion with opposite ends and a support surface for the electrical circuit component, endwalls extending outwardly from said support surface adjacent said ends of said base portion, said endwalls having terminal outer ends, said endwalls having front surfaces that extend between said outer ends of said endwalls and said base portion of said holder, said front surfaces having openings therein for receiving leads on the electrical circuit component positionable between said endwalls on said support surface, said openings in said front surfaces being closely adjacent said outer ends of said endwalls, and said front surfaces of said endwalls being inwardly concavely curved between said openings and said base portion of said holder.

* * * * *